US007791053B2

(12) United States Patent
Buttrill

(10) Patent No.: US 7,791,053 B2
(45) Date of Patent: Sep. 7, 2010

(54) DEPRESSED ANODE WITH PLASMON-ENABLED DEVICES SUCH AS ULTRA-SMALL RESONANT STRUCTURES

(75) Inventor: Sidney E. Buttrill, Palo Alto, CA (US)

(73) Assignee: Virgin Islands Microsystems, Inc., St. Thomas, VI (US)

( * ) Notice: Subject to any disclaimer, the term of this patent is extended or adjusted under 35 U.S.C. 154(b) by 198 days.

(21) Appl. No.: 12/247,875

(22) Filed: Oct. 8, 2008

(65) Prior Publication Data

US 2009/0230332 A1 Sep. 17, 2009

Related U.S. Application Data

(60) Provisional application No. 60/960,694, filed on Oct. 10, 2007.

(51) Int. Cl.
*H01L 31/115* (2006.01)
*G01K 1/08* (2006.01)
*H05H 3/00* (2006.01)

(52) U.S. Cl. .............. 250/493.1; 250/494.1; 250/503.1; 250/504 R; 359/577; 359/580; 359/583; 359/584; 359/586; 359/588; 359/589; 359/634; 359/839; 362/293; 362/800; 372/7; 385/14; 977/932; 977/949; 977/950

(58) Field of Classification Search ....................... None
See application file for complete search history.

(56) References Cited

U.S. PATENT DOCUMENTS

| | | | |
|---|---|---|---|
| 1,948,384 | A | 2/1934 | Lawrence |
| 2,307,086 | A | 1/1943 | Varian et al. |
| 2,431,396 | A | 11/1947 | Hansell |
| 2,473,477 | A | 6/1949 | Smith |
| 2,634,372 | A | 4/1953 | Winfield |
| 2,932,798 | A | 4/1960 | Kerst et al. |
| 2,944,183 | A | 7/1960 | Drexler |
| 2,966,611 | A | 12/1960 | Sandstrom |
| 3,231,779 | A | 1/1966 | White |
| 2,397,905 | A | 1/1967 | Rockwell et al. |
| 3,297,905 | A | 1/1967 | Rockwell et al. |
| 3,315,117 | A | 4/1967 | Udelson |
| 3,387,169 | A | 6/1968 | Farney |
| 3,543,147 | A | 11/1970 | Kovarik |

(Continued)

FOREIGN PATENT DOCUMENTS

EP 0237559 B1 12/1991

(Continued)

OTHER PUBLICATIONS

U.S. Appl. No. 11/418,082, filed May 5, 2006, Gorrell et al.

(Continued)

*Primary Examiner*—David A Vanore
(74) *Attorney, Agent, or Firm*—Davidson Berquist Jackson & Gowdey LLP

(57) ABSTRACT

Plasmon-enable devices such as ultra-small resonant devices produce electromagnetic radiation at frequencies in excess of microwave frequencies when induced to resonate by a passing electron beam. The resonant devices are surrounded by one or more depressed anodes to recover energy from the passing electron beam as/after the beam couples its energy into the ultra-small resonant devices.

7 Claims, 3 Drawing Sheets

U.S. PATENT DOCUMENTS 3,546,524 A 12/1970 Stark
3,560,694 A 2/1971 White
3,571,642 A 3/1971 Westcott
3,586,899 A 6/1971 Fleisher
3,761,828 A 9/1973 Pollard et al.
3,886,399 A 5/1975 Symons
3,923,568 A 12/1975 Bersin
3,989,347 A 11/1976 Eschler
4,053,845 A 10/1977 Gould
4,282,436 A 8/1981 Kapetanakos
4,450,554 A 5/1984 Steensma et al.
4,453,108 A 6/1984 Freeman, Jr.
4,482,779 A 11/1984 Anderson
4,528,659 A 7/1985 Jones, Jr.
4,589,107 A 5/1986 Middleton et al.
4,598,397 A 7/1986 Nelson et al.
4,630,262 A 12/1986 Callens et al.
4,652,703 A 3/1987 Lu et al.
4,661,783 A 4/1987 Gover et al.
4,704,583 A 11/1987 Gould
4,712,042 A 12/1987 Hamm
4,713,581 A 12/1987 Haimson
4,727,550 A 2/1988 Chang et al.
4,740,963 A 4/1988 Eckley
4,740,973 A 4/1988 Madey
4,746,201 A 5/1988 Gould
4,761,059 A 8/1988 Yeh et al.
4,782,485 A 11/1988 Gollub
4,789,945 A 12/1988 Niijima
4,806,859 A 2/1989 Hetrick
4,809,271 A 2/1989 Kondo et al.
4,813,040 A 3/1989 Futato
4,819,228 A 4/1989 Baran et al.
4,829,527 A 5/1989 Wortman et al.
4,838,021 A 6/1989 Beattie
4,841,538 A 6/1989 Yanabu et al.
4,864,131 A 9/1989 Rich et al.
4,866,704 A 9/1989 Bergman
4,866,732 A 9/1989 Carey et al.
4,873,715 A 10/1989 Shibata
4,887,265 A 12/1989 Felix
4,890,282 A 12/1989 Lambert et al.
4,898,022 A 2/1990 Yumoto et al.
4,912,705 A 3/1990 Paneth et al.
4,932,022 A 6/1990 Keeney et al.
4,981,371 A 1/1991 Gurak et al.
5,023,563 A 6/1991 Harvey et al.
5,036,513 A 7/1991 Greenblatt
5,065,425 A 11/1991 Lecomte et al.
5,113,141 A 5/1992 Swenson
5,121,385 A 6/1992 Tominaga et al.
5,127,001 A 6/1992 Steagall et al.
5,128,729 A 7/1992 Alonas et al.
5,130,985 A 7/1992 Kondo et al.
5,150,410 A 9/1992 Bertrand
5,155,726 A 10/1992 Spinney et al.
5,157,000 A 10/1992 Elkind et al.
5,163,118 A 11/1992 Lorenzo et al.
5,185,073 A 2/1993 Bindra
5,187,591 A 2/1993 Guy et al.
5,199,918 A 4/1993 Kumar
5,214,650 A 5/1993 Renner et al.
5,233,623 A 8/1993 Chang
5,235,248 A 8/1993 Clark et al.
5,262,656 A 11/1993 Blondeau et al.
5,263,043 A 11/1993 Walsh
5,268,693 A 12/1993 Walsh
5,268,788 A 12/1993 Fox et al.
5,282,197 A 1/1994 Kreitzer
5,283,819 A 2/1994 Glick et al.
5,293,175 A 3/1994 Hemmie et al.
5,302,240 A 4/1994 Hori et al.
5,305,312 A 4/1994 Fornek et al.
5,341,374 A 8/1994 Lewen et al.
5,354,709 A 10/1994 Lorenzo et al.
5,446,814 A 8/1995 Kuo et al.
5,504,341 A 4/1996 Glavish
5,578,909 A 11/1996 Billen
5,604,352 A 2/1997 Schuetz
5,608,263 A 3/1997 Drayton et al.
5,663,971 A 9/1997 Carlsten
5,666,020 A 9/1997 Takemura
5,668,368 A 9/1997 Sakai et al.
5,705,443 A 1/1998 Stauf et al.
5,737,458 A 4/1998 Wojnarowski et al.
5,744,919 A 4/1998 Mishin et al.
5,757,009 A 5/1998 Walstrom
5,767,013 A 6/1998 Park et al.
5,780,970 A 7/1998 Singh et al.
5,790,585 A 8/1998 Walsh
5,811,943 A 9/1998 Mishin et al.
5,821,836 A 10/1998 Katehi et al.
5,821,902 A 10/1998 Keen
5,825,140 A 10/1998 Fujisawa
5,831,270 A 11/1998 Nakasuji
5,847,745 A 12/1998 Shimizu et al.
5,889,449 A 3/1999 Fiedziuszko
5,889,797 A 3/1999 Nguyen
5,902,489 A 5/1999 Yasuda et al.
5,963,857 A 10/1999 Greywall
5,972,193 A 10/1999 Chou et al.
6,005,347 A 12/1999 Lee
6,008,496 A 12/1999 Winefordner et al.
6,040,625 A 3/2000 Ip
6,060,833 A 5/2000 Velazco
6,080,529 A 6/2000 Ye et al.
6,117,784 A 9/2000 Uzoh
6,139,760 A 10/2000 Shim et al.
6,180,415 B1 1/2001 Schultz et al.
6,195,199 B1 2/2001 Yamada
6,222,866 B1 4/2001 Seko
6,278,239 B1 8/2001 Caporaso et al.
6,281,769 B1 8/2001 Fiedziuszko
6,297,511 B1 10/2001 Syllaios et al.
6,301,041 B1 10/2001 Yamada
6,309,528 B1 10/2001 Taylor et al.
6,316,876 B1 11/2001 Tanabe
6,338,968 B1 1/2002 Hefti
6,370,306 B1 4/2002 Sato et al.
6,373,194 B1 4/2002 Small
6,376,258 B2 4/2002 Hefti
6,407,516 B1 6/2002 Victor
6,441,298 B1 8/2002 Thio
6,448,850 B1 9/2002 Yamada
6,453,087 B2 9/2002 Frish et al.
6,470,198 B1 10/2002 Kintaka et al.
6,504,303 B2 1/2003 Small
6,525,477 B2 2/2003 Small
6,534,766 B2 3/2003 Abe et al.
6,545,425 B2 4/2003 Victor
6,552,320 B1 4/2003 Pan
6,577,040 B2 6/2003 Nguyen
6,580,075 B2 6/2003 Kametani et al.
6,603,781 B1 8/2003 Stinson et al.
6,603,915 B2 8/2003 Glebov et al.
6,624,916 B1 9/2003 Green et al.
6,636,185 B1 10/2003 Spitzer et al.
6,636,534 B2 10/2003 Madey et al.
6,636,653 B2 10/2003 Miracky et al.
6,640,023 B2 10/2003 Miller et al.
6,642,907 B2 11/2003 Hamada et al.
6,687,034 B2 2/2004 Wine et al.
6,700,748 B1 3/2004 Cowles et al.
6,724,486 B1 4/2004 Shull et al.

| | | | | |
|---|---|---|---|---|
| 6,738,176 | B2 | 5/2004 | Rabinowitz et al. | |
| 6,741,781 | B2 | 5/2004 | Furuyama | |
| 6,777,244 | B2 | 8/2004 | Pepper et al. | |
| 6,782,205 | B2 | 8/2004 | Trisnadi et al. | |
| 6,791,438 | B2 | 9/2004 | Takahashi et al. | |
| 6,800,877 | B2 | 10/2004 | Victor et al. | |
| 6,801,002 | B2 | 10/2004 | Victor et al. | |
| 6,819,432 | B2 | 11/2004 | Pepper et al. | |
| 6,829,286 | B1 | 12/2004 | Guilfoyle et al. | |
| 6,834,152 | B2 | 12/2004 | Gunn et al. | |
| 6,870,438 | B1 | 3/2005 | Shino et al. | |
| 6,871,025 | B2 | 3/2005 | Maleki et al. | |
| 6,885,262 | B2 | 4/2005 | Nishimura et al. | |
| 6,900,447 | B2 | 5/2005 | Gerlach et al. | |
| 6,909,092 | B2 | 6/2005 | Nagahama | |
| 6,909,104 | B1 | 6/2005 | Koops | |
| 6,924,920 | B2 | 8/2005 | Zhilkov | |
| 6,936,981 | B2 | 8/2005 | Gesley | |
| 6,943,650 | B2 | 9/2005 | Ramprasad et al. | |
| 6,944,369 | B2 | 9/2005 | Deliwala | |
| 6,952,492 | B2 | 10/2005 | Tanaka et al. | |
| 6,953,291 | B2 | 10/2005 | Liu | |
| 6,954,515 | B2 | 10/2005 | Bjorkholm et al. | |
| 6,965,284 | B2 | 11/2005 | Maekawa et al. | |
| 6,965,625 | B2 | 11/2005 | Mross et al. | |
| 6,972,439 | B1 | 12/2005 | Kim et al. | |
| 6,995,406 | B2 | 2/2006 | Tojo et al. | |
| 7,010,183 | B2 | 3/2006 | Estes et al. | |
| 7,064,500 | B2 | 6/2006 | Victor et al. | |
| 7,068,948 | B2 | 6/2006 | Wei et al. | |
| 7,092,588 | B2 | 8/2006 | Kondo | |
| 7,092,603 | B2 | 8/2006 | Glebov et al. | |
| 7,122,978 | B2 | 10/2006 | Nakanishi et al. | |
| 7,130,102 | B2 | 10/2006 | Rabinowitz | |
| 7,177,515 | B2 | 2/2007 | Estes et al. | |
| 7,194,798 | B2 | 3/2007 | Bonhote et al. | |
| 7,230,201 | B1 | 6/2007 | Miley et al. | |
| 7,253,426 | B2 | 8/2007 | Gorrell et al. | |
| 7,267,459 | B2 | 9/2007 | Matheson | |
| 7,267,461 | B2 | 9/2007 | Kan et al. | |
| 7,309,953 | B2 | 12/2007 | Tiberi et al. | |
| 7,342,441 | B2 | 3/2008 | Gorrell et al. | |
| 7,362,972 | B2 | 4/2008 | Yavor et al. | |
| 7,375,631 | B2 | 5/2008 | Moskowitz et al. | |
| 7,436,177 | B2 | 10/2008 | Gorrell et al. | |
| 7,442,940 | B2 | 10/2008 | Gorrell et al. | |
| 7,443,358 | B2 | 10/2008 | Gorrell et al. | |
| 7,470,920 | B2 | 12/2008 | Gorrell et al. | |
| 7,473,917 | B2 | 1/2009 | Singh | |
| 7,557,365 | B2 * | 7/2009 | Gorrell et al. | 250/503.1 |
| 7,583,370 | B2 * | 9/2009 | Gorrell et al. | 356/73.1 |
| 7,586,097 | B2 * | 9/2009 | Gorrell et al. | 250/396 R |
| 7,586,167 | B2 | 9/2009 | Gorrell et al. | |
| 7,626,179 | B2 * | 12/2009 | Gorrell et al. | 250/396 R |
| 7,646,991 | B2 * | 1/2010 | Gorrell et al. | 398/201 |
| 7,656,094 | B2 * | 2/2010 | Gorrell et al. | 315/5.38 |
| 7,659,513 | B2 * | 2/2010 | Gorrell et al. | 250/341.1 |
| 7,710,040 | B2 * | 5/2010 | Gorrell et al. | 315/5.39 |
| 7,714,513 | B2 * | 5/2010 | Gorrell et al. | 315/5.39 |
| 7,728,397 | B2 * | 6/2010 | Gorrell et al. | 257/429 |
| 2001/0002315 | A1 | 5/2001 | Schultz et al. | |
| 2001/0025925 | A1 | 10/2001 | Abe et al. | |
| 2002/0009723 | A1 | 1/2002 | Hefti | |
| 2002/0027481 | A1 | 3/2002 | Fiedziuszko | |
| 2002/0036121 | A1 | 3/2002 | Ball et al. | |
| 2002/0036264 | A1 | 3/2002 | Nakasuji et al. | |
| 2002/0053638 | A1 | 5/2002 | Winkler et al. | |
| 2002/0068018 | A1 | 6/2002 | Pepper et al. | |
| 2002/0070671 | A1 | 6/2002 | Small | |
| 2002/0071457 | A1 | 6/2002 | Hogan | |
| 2002/0122531 | A1 | 9/2002 | Whitham | |
| 2002/0135665 | A1 | 9/2002 | Gardner | |
| 2002/0139961 | A1 | 10/2002 | Kinoshita et al. | |

| | | | | |
|---|---|---|---|---|
| 2002/0158295 | A1 | 10/2002 | Armgarth et al. | |
| 2002/0191650 | A1 | 12/2002 | Madey et al. | |
| 2003/0010979 | A1 | 1/2003 | Pardo | |
| 2003/0012925 | A1 | 1/2003 | Gorrell | |
| 2003/0016421 | A1 | 1/2003 | Small | |
| 2003/0034535 | A1 | 2/2003 | Barenburu et al. | |
| 2003/0103150 | A1 | 6/2003 | Catrysse et al. | |
| 2003/0106998 | A1 | 6/2003 | Colbert et al. | |
| 2003/0155521 | A1 | 8/2003 | Feuerbaum | |
| 2003/0158474 | A1 | 8/2003 | Scherer et al. | |
| 2003/0164947 | A1 | 9/2003 | Vaupel | |
| 2003/0179974 | A1 | 9/2003 | Estes et al. | |
| 2003/0206708 | A1 | 11/2003 | Estes et al. | |
| 2003/0214695 | A1 | 11/2003 | Abramson et al. | |
| 2004/0061053 | A1 | 4/2004 | Taniguchi et al. | |
| 2004/0080285 | A1 | 4/2004 | Victor et al. | |
| 2004/0085159 | A1 | 5/2004 | Kubena et al. | |
| 2004/0092104 | A1 | 5/2004 | Gunn, III et al. | |
| 2004/0108471 | A1 | 6/2004 | Luo et al. | |
| 2004/0108473 | A1 | 6/2004 | Melnychuk et al. | |
| 2004/0108823 | A1 | 6/2004 | Amaldi et al. | |
| 2004/0136715 | A1 | 7/2004 | Kondo | |
| 2004/0150991 | A1 | 8/2004 | Ouderkirk et al. | |
| 2004/0171272 | A1 | 9/2004 | Jin et al. | |
| 2004/0180244 | A1 | 9/2004 | Tour et al. | |
| 2004/0184270 | A1 | 9/2004 | Halter | |
| 2004/0213375 | A1 | 10/2004 | Bjorkholm et al. | |
| 2004/0217297 | A1 | 11/2004 | Moses et al. | |
| 2004/0218651 | A1 | 11/2004 | Iwasaki et al. | |
| 2004/0231996 | A1 | 11/2004 | Webb | |
| 2004/0240035 | A1 | 12/2004 | Zhilkov | |
| 2004/0264867 | A1 | 12/2004 | Kondo | |
| 2005/0023145 | A1 | 2/2005 | Cohen et al. | |
| 2005/0045821 | A1 | 3/2005 | Noji et al. | |
| 2005/0045832 | A1 | 3/2005 | Kelly et al. | |
| 2005/0054151 | A1 | 3/2005 | Lowther et al. | |
| 2005/0067286 | A1 | 3/2005 | Ahn et al. | |
| 2005/0082469 | A1 | 4/2005 | Carlo | |
| 2005/0092929 | A1 | 5/2005 | Schneiker | |
| 2005/0104684 | A1 | 5/2005 | Wojcik | |
| 2005/0105690 | A1 | 5/2005 | Pau et al. | |
| 2005/0145882 | A1 | 7/2005 | Taylor et al. | |
| 2005/0152635 | A1 | 7/2005 | Paddon et al. | |
| 2005/0162104 | A1 | 7/2005 | Victor et al. | |
| 2005/0190637 | A1 | 9/2005 | Ichimura et al. | |
| 2005/0194258 | A1 | 9/2005 | Cohen et al. | |
| 2005/0201707 | A1 | 9/2005 | Glebov et al. | |
| 2005/0201717 | A1 | 9/2005 | Matsumura et al. | |
| 2005/0212503 | A1 | 9/2005 | Deibele | |
| 2005/0231138 | A1 | 10/2005 | Nakanishi et al. | |
| 2005/0249451 | A1 | 11/2005 | Baehr-Jones et al. | |
| 2005/0285541 | A1 | 12/2005 | LeChevalier | |
| 2006/0007730 | A1 | 1/2006 | Nakamura et al. | |
| 2006/0018619 | A1 | 1/2006 | Helffrich et al. | |
| 2006/0035173 | A1 | 2/2006 | Davidson et al. | |
| 2006/0045418 | A1 | 3/2006 | Cho et al. | |
| 2006/0050269 | A1 | 3/2006 | Brownell | |
| 2006/0060782 | A1 | 3/2006 | Khursheed | |
| 2006/0062258 | A1 | 3/2006 | Brau et al. | |
| 2006/0131176 | A1 | 6/2006 | Hsu | |
| 2006/0131695 | A1 | 6/2006 | Kuekes et al. | |
| 2006/0159131 | A1 | 7/2006 | Liu et al. | |
| 2006/0164496 | A1 | 7/2006 | Tokutake et al. | |
| 2006/0187794 | A1 | 8/2006 | Harvey et al. | |
| 2006/0208667 | A1 | 9/2006 | Lys et al. | |
| 2006/0216940 | A1 | 9/2006 | Gorrell et al. | |
| 2006/0243925 | A1 | 11/2006 | Barker et al. | |
| 2006/0274922 | A1 | 12/2006 | Ragsdale | |
| 2007/0003781 | A1 | 1/2007 | de Rochemont | |
| 2007/0013765 | A1 | 1/2007 | Hudson et al. | |
| 2007/0075263 | A1 | 4/2007 | Gorrell et al. | |
| 2007/0075264 | A1 | 4/2007 | Gorrell et al. | |
| 2007/0075907 | A1 * | 4/2007 | Gorrell et al. | 343/786 |

2007/0085039 A1* 4/2007 Gorrell et al. ............ 250/494.1
2007/0086915 A1 4/2007 LeBoeuf et al.
2007/0116420 A1 5/2007 Estes et al.
2007/0146704 A1 6/2007 Schmidt et al.
2007/0152176 A1 7/2007 Gorrell et al.
2007/0154846 A1* 7/2007 Gorrell et al. ............... 430/313
2007/0170370 A1* 7/2007 Gorrell et al. ........... 250/396 R
2007/0194357 A1 8/2007 Oohashi
2007/0200940 A1 8/2007 Gruhlke et al.
2007/0238037 A1 10/2007 Wuister et al.
2007/0252983 A1 11/2007 Tong et al.
2007/0257619 A1* 11/2007 Gorrell et al. ............. 315/5.39
2007/0258492 A1 11/2007 Gorrell
2007/0258689 A1 11/2007 Gorrell et al.
2007/0258690 A1 11/2007 Gorrell et al.
2007/0259488 A1* 11/2007 Gorrell et al. ............... 438/185
2007/0259641 A1 11/2007 Gorrell et al.
2007/0264023 A1* 11/2007 Gorrell et al. ............... 398/140
2007/0264030 A1* 11/2007 Gorrell et al. ............... 398/200
2007/0282030 A1 12/2007 Anderson et al.
2007/0284527 A1 12/2007 Zani et al.
2008/0069509 A1 3/2008 Gorrell et al.
2008/0302963 A1 12/2008 Nakasuji et al.
2009/0230332 A1* 9/2009 Buttrill .................... 250/503.1

FOREIGN PATENT DOCUMENTS

| | | | |
|---|---|---|---|
| JP | 2004-32323 | A | 1/2004 |
| WO | WO 87/01873 | | 3/1987 |
| WO | WO 93/21663 | A1 | 10/1993 |
| WO | WO 00/72413 | | 11/2000 |
| WO | WO 02/25785 | | 3/2002 |
| WO | WO 02/077607 | | 10/2002 |
| WO | WO 2004/086560 | | 10/2004 |
| WO | WO 2005/015143 | A2 | 2/2005 |
| WO | WO 2005/098966 | | 10/2005 |
| WO | WO 2006/042239 | A2 | 4/2006 |
| WO | WO 2007/081389 | | 7/2007 |
| WO | WO 2007/081390 | | 7/2007 |
| WO | WO 2007/081391 | | 7/2007 |

OTHER PUBLICATIONS

"An Early History—Invention of the Klystron," http://varianinc.com/cgi-bin/advprint/print.cgi?cid=KLQNPPJJFJ, printed on Dec. 26, 2008.
"An Early History—The Founding of Varian Associates," http://varianinc.com/cgi-bin/advprint/print.cgi?cid=KLQNPPJJFJ, printed on Dec. 26, 2008.
"Array of Nanoklystrons for Frequency Agility or Redundancy," NASA's Jet Propulsion Laboratory, NASA Tech Briefs, NPO-21033. 2001.
"Chapter 3 X-Ray Tube," http://compepid.tuskegee.edu/syllabi/clinical/small/radiology/chapter..., printed from tuskegee.edu on Dec. 29, 2008.
"Diagnostic imaging modalities—Ionizing vs non-ionizing radiation," http://info.med.yale.edu/intmed/cardio/imaging/techniques/ionizing_v..., printed from Yale University School of Medicine on Dec. 29, 2008.
"Frequently Asked Questions," Luxtera Inc., found at http://www.luxtera.com/technology_faq.htm, printed on Dec. 2, 2005, 4 pages.
"Hardware Development Programs," Calabazas Creek Research, Inc. found at http://calcreek.com/hardware.html.
"Klystron Amplifier," http://www.radartutorial.eu/08.transmitters/tx12.en.html, printed on Dec. 26, 2008.
"Klystron is a Micowave Generator," http://www2.slac.stanford.edu/vvc/accelerators/klystron.html, printed on Dec. 26, 2008.
"Klystron," http:en.wikipedia.org/wiki/Klystron, printed on Dec. 26, 2008.
"Making X-rays," http://www.fnrfscience.cmu.ac.th/theory/radiation/xray-basics.html, printed on Dec. 29, 2008.
"Microwave Tubes," http://www.tpub.com/neets/book11/45b.htm, printed on Dec. 26, 2008.
"Notice of Allowability" mailed on Jan. 17, 2008 in U.S. Appl. No. 11/418,082, filed May 5, 2006.
"Technology Overview," Luxtera, Inc., found at http://www.luxtera.com/technology.htm, printed on Dec. 2, 2005, 1 page.
"The Reflex Klystron," http://www.fnrfscience.cmu.ac.th/theory/microwave/microwave%2, printed from Fast Netoron Research Facilty on Dec. 26, 2008.
"x-ray tube," http://www.answers.com/topic/x-ray-tube, printed on Dec. 29, 2008.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Mar. 24, 2006 PTO Office Action in U.S. Appl. No. 10/917,511.
Mar. 25, 2008 PTO Office Action in U.S. Appl. No. 11/411,131.
Apr. 8, 2008 PTO Office Action in U.S. Appl. No. 11/325,571.
Apr. 17, 2008 Response to PTO Office Action of Dec. 20, 2007 in U.S. Appl. No. 11/418,087.
Apr. 19, 2007 Response to PTO Office Action of Jan. 17, 2007 in U.S. Appl. No. 11/418,082.
May 10, 2005 PTO Office Action in U.S. Appl. No. 10/917,511.
May 21, 2007 PTO Office Action in U.S. Appl. No. 11/418,087.
May 26, 2006 Response to PTO Office Action of Mar. 24, 2006 in U.S. Appl. No. 10/917,511.
Jun. 16, 2008 Response to PTO Office Action of Dec. 14, 2007 in U.S. Appl. No. 11/418,264.
Jun. 20, 2008 Response to PTO Office Action of Mar. 25, 2008 in U.S. Appl. No. 11/411,131.
Aug. 14, 2006 PTO Office Action in U.S. Appl. No. 10/917,511.
Sep. 1, 2006 Response to PTO Office Action of Aug. 14, 2006 in U.S. Appl. No. 10/917,511.
Sep. 12, 2005 Response to PTO Office Action of May 10, 2005 in U.S. Appl. No. 10/917,511.
Sep. 14, 2007 PTO Office Action in U.S. Appl. No. 11/411,131.
Oct. 19, 2007 Response to PTO Office Action of May 21, 2007 in U.S. Appl. No. 11/418,087.
Dec. 4, 2006 PTO Office Action in U.S. Appl. No. 11/418,087.
Dec. 14, 2007 PTO Office Action in U.S. Appl. No. 11/418,264.
Dec. 14, 2007 Response to PTO Office Action of Sep. 14, 2007 in U.S. Appl. No. 11/411,131.
Dec. 20, 2007 PTO Office Action in U.S. Appl. No. 11/418,087.
Alford, T.L. et al., "Advanced silver-based metallization patterning for ULSI applications," Microelectronic Engineering 55, 2001, pp. 383-388, Elsevier Science B.V.
Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1-050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Electron Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32. No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved μFEL Performance with Novel Resonator," Jan. 7, 2005, from website: www.frascati.enea.it/thz-bridge/workshop/presentations/Wednesday/We-07-Brownell.ppt.

Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.
Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.
Chuang, S.L. et al., "Smith-Purcell Radiation from a Charge Moving Above a Penetrable Grating," IEEE MTT-S Digest, 1983, pp. 405-406, IEEE.
Corcoran, Elizabeth, "Ride the Light," Forbes Magazine, Apr. 11, 2005, pp. 68-70.
European Search Report mailed Mar. 3, 2009 in European Application No. 06852028.7.
Far-IR, Sub-MM & MM Detector Technology Workshop list of manuscripts, session 6 2002.
Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp. 584-597.
Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.
Gallerano, G.P. et al., "Overview of Terahertz Radiation Sources," Proceedings of the 2004 FEL Conference, pp. 216-221.
Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.
Gover, A. et al., "Angular Radiation Pattern of Smith-Purcell Radiation," Journal of the Optical Society of America, Oct. 1984, pp. 723-728, vol. 1 No. 5, Optical Society of America.
Grishin, Yu. A. et al., "Pulsed Orotron—A New Microwave Source for Submillimeter Pulse High-Field Electron Paramagnetic Resonance Spectroscopy," Review of Scientific Instruments, Sep. 2004, pp. 2926-2936, vol. 75 No. 9, American Institute of Physics.
International Search Report and Written Opinion mailed Nov. 23, 2007 in International Application No. PCT/US2006/022786.
Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.
Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.
Ives, Lawrence et al., "Development of Backward Wave Oscillators for Terahertz Applications," Terahertz for Military and Security Applications, Proceedings of SPIE vol. 5070 (2003), pp. 71-82.
Ives, R. Lawrence, "IVEC Summary, Session 2, Sources I" 2002.
J. C. Palais, "Fiber optic communications," Prentice Hall, New Jersey, 1998, pp. 156-158.
Jonietz, Erika, "Nano Antenna Gold nanospheres show path to all-optical computing," Technology Review, Dec. 2005/Jan. 2006, p. 32.
Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA, Nov. 1995, pp. 117-121.
Joo, Youngcheol et al., "Fabrication of Monolithic Microchannels for IC Chip Cooling," 1995, Mechanical, Aerospace and Nuclear Engineering Department, University of California at Los Angeles.
Jung, K.B. et al., "Patterning of Cu, Co, Fe, and Ag for magnetic nanostructures," J. Vac. Sci. Technol. A 15(3), May/Jun. 1997, pp. 1780-1784.
Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.
Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.
Kim, Shang Hoon, "Quantum Mechanical Theory of Free-Electron Two-Quantum Stark Emission Driven by Transverse Motion," Journal of the Physical Society of Japan, Aug. 1993, vol. 62 No. 8, pp. 2528-2532.
Korbly, S.E. et al., "Progress on a Smith-Purcell Radiation Bunch Length Diagnostic," Plasma Science and Fusion Center, MIT, Cambridge, MA.
Kormann, T. et al., "A Photoelectron Source for the Study of Smith-Purcell Radiation".
Kube, G. et al., "Observation of Optical Smith-Purcell Radiation at an Electron Beam Energy of 855 MeV," Physical Review E, May 8, 2002, vol. 65, The American Physical Society, pp. 056501-1-056501-15.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Liu, Chuan Sheng, et al., "Stimulated Coherent Smith-Purcell Radiation from a Metallic Grating," IEEE Journal of Quantum Electronics, Oct. 1999, pp. 1386-1389, vol. 35, No. 10, IEEE.
Manohara, Harish et al., "Field Emission Testing of Carbon Nanotubes for THz Frequency Vacuum Microtube Sources." Abstract. Dec. 2003. from SPIEWeb.
Manohara, Harish M. et al., "Design and Fabrication of a THz Nanoklystron".
Manohara, Harish M. et al., "Design and Fabrication of a THz Nanoklystron" (www.sofia.usra.edu/det_workshop/ posters/session 3/3-43manohara_poster.pdf), PowerPoint Presentation.
Markoff, John, "A Chip That Can Transfer Data Using Laser Light," The New York Times, Sep. 18, 2006.
McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.
Meyer, Stephan, "Far IR, Sub-MM & MM Detector Technology Workshop Summary," Oct. 2002. (may date the Manohara documents).
Mokhoff, Nicolas, "Optical-speed light detector promises fast space talk," EETimes Online, Mar. 20, 2006, from website: www.eetimes.com/showArticle.jhtml?articleID=183701047.
Neo et al., "Smith-Purcell Radiation from Ultraviolet to Infrared Using a Si-field Emitter" Vacuum Electronics Conference, 2007, IVEC '07, IEEE International May 2007.
Nguyen, Phucanh et al., "Novel technique to pattern silver using CF4 and CF4/O2 glow discharges," J.Vac. Sci. Technol. B 19(1), Jan./Feb. 2001, American Vacuum Society, pp. 158-165.
Nguyen, Phucanh et al., "Reactive ion etch of patterned and blanket silver thin films in Cl2/O2 and O2 glow discharges," J. Vac. Sci, Technol. B. 17(5), Sep./Oct. 1999, American Vacuum Society, pp. 2204-2209.
Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.
Ossia, Babak, "The X-Ray Production," Department of Biomedical Engineering—University of Rhode Island, 1 page.
Phototonics Research, "Surface-Plasmon-Enhanced Random Laser Demonstrated," Phototonics Spectra, Feb. 2005, pp. 112-113.
Platt, C.L. et al., "A New Resonator Design for Smith-Purcell Free Electron Lasers," 6Q19, p. 296.
Potylitsin, A.P., "Resonant Diffraction Radiation and Smith-Purcell Effect," (Abstract), arXiv: physics/9803043 v2 Apr. 13, 1998.
Potylitsyn, A.P., "Resonant Diffraction Radiation and Smith-Purcell Effect," Physics Letters A, Feb. 2, 1998, pp. 112-116, A 238, Elsevier Science B.V.
S. Hoogland et al., "A solution-processed 1.53 μm quantum dot laser with temperature-invariant emission wavelength," Optics Express, vol. 14, No. 8, Apr. 17, 2006, pp. 3273-3281.
S.M. Sze, "Semiconductor Devices Physics and Technology", 2nd Edition, Chapters 9 and 12, Copyright 1985, 2002.
Sartori, Gabriele, "CMOS Photonics Platform," Luxtera, Inc., Nov. 2005, 19 pages.
Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.
Schachter, Levi, "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.
Schachter, Levi, "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.
Search Report and Writen Opinion mailed Jul. 14, 2008 in PCT Appln. No. PCT/US2006/022773.
Search Report and Written Opinion mailed Apr. 23, 2008 in PCT Appln. No. PCT/US2006/022678.
Search Report and Written Opinion mailed Apr. 3, 2008 in PCT Appln. No. PCT/US2006/027429.
Search Report and Written Opinion mailed Aug. 19, 2008 in PCT Appln. No. PCT/US2007/008363.
Search Report and Written Opinion mailed Aug. 24, 2007 in PCT Appln. No. PCT/US2006/022768.
Search Report and Written Opinion mailed Aug. 31, 2007 in PCT Appln. No. PCT/US2006/022680.
Search Report and Written Opinion mailed Dec. 20, 2007 in PCT Appln. No. PCT/US2006/022771.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.
Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Jan. 31, 2008 in PCT Appln. No. PCT/US2006/027427.
Search Report and Written Opinion mailed Jan. 8, 2008 in PCT Appln. No. PCT/US2006/028741.
Search Report and Written Opinion mailed Jul. 16, 2007 in PCT Appln. No. PCT/US2006/022774.
Search Report and Written Opinion mailed Jul. 16, 2008 in PCT Appln. No. PCT/US2006/022766.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Jun. 18, 2008 in PCT Appln. No. PCT/US2006/027430.
Search Report and Written Opinion mailed Jun. 20, 2007 in PCT Appln. No. PCT/US2006/022779.
Search Report and Written Opinion mailed Jun. 3, 2008 in PCT Appln. No. PCT/US2006/022783.
Search Report and Written Opinion mailed Mar. 11, 2008 in PCT Appln. No. PCT/US2006/022679.
Search Report and Written Opinion mailed Mar. 24, 2008 in PCT Appln. No. PCT/US2006/022677.
Search Report and Written Opinion mailed Mar. 24, 2008 in PCT Appln. No. PCT/US2006/022784.
Search Report and Written Opinion mailed Mar. 7, 2007 in PCT Appln. No. PCT/US2006/022775.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
Search Report and Written Opinion mailed Oct. 25, 2007 in PCT Appln. No. PCT/US2006/022687.
Search Report and Written Opinion mailed Oct. 26, 2007 in PCT Appln. No. PCT/US2006/022675.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022689.
Search Report and Written Opinion mailed Sep. 17, 2007 in PCT Appln. No. PCT/US2006/022787.
Search Report and Written Opinion mailed Sep. 2, 2008 in PCT Appln. No. PCT/US2006/022769.
Search Report and Written Opinion mailed Sep. 21, 2007 in PCT Appln. No. PCT/US2006/022688.
Search Report and Written Opinion mailed Sep. 25, 2007 in PCT appln. No. PCT/US2006/022681.
Search Report and Written Opinion mailed Sep. 26, 2007 in PCT Appln. No. PCT/US2006/024218.
Search Report and Written Opinion mailed Sep. 26, 2008 in PCT Appln. No. PCT/US2007/00053.
Search Report and Written Opinion mailed Sep. 3, 2008 in PCT Appln. No. PCT/US2006/022770.
Search Report and Written Opinion mailed Sep. 5, 2007 in PCT Appl. No. PCT/US2006/027428.
Shih, I. et al., "Experimental Investigations of Smith-Purcell Radiation," Journal of the Optical Society of America, Mar. 1990, pp. 351-356, vol. 7, No. 3, Optical Society of America.
Shih, I. et al., "Measurements of Smith-Purcell Radiation," Journal of the Optical Society of America, Mar. 1990, pp. 345-350, vol. 7 No. 3, Optical Society of America.
Speller et al., "A Low-Noise MEMS Accelerometer for Unattended Ground Sensor Applications", Applied MEMS Inc., 12200 Parc Crest, Stafford, TX, USA 77477.
Swartz, J.C. et al., "THz-FIR Grating Coupled Radiation Source," Plasma Science, 1998. 1D02, p. 126.
Temkin, Richard, "Scanning with Ease Through the Far Infrared," Science, New Series, May 8, 1998, p. 854, vol. 280, No. 5365, American Association for the Advancement of Science.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
U.S. Appl. No. 11/203,407—Nov. 13, 2008 PTO Office Action.
U.S. Appl. No. 11/238,991—Dec. 6, 2006 PTO Office Action.
U.S. Appl. No. 11/238,991—Jun. 6, 2007 Response to PTO Office Action of Dec. 6, 2006.
U.S. Appl. No. 11/238,991—Sep. 10, 2007 PTO Office Action.
U.S. Appl. No. 11/238,991—Mar. 6, 2008 Response to PTO Office Action of Sep. 10, 2007.
U.S. Appl. No. 11/238,991—Jun. 27, 2008 PTO Office Action.
U.S. Appl. No. 11/238,991—Dec. 29, 2008 Response to PTO Office Action of Jun. 27, 2008.
U.S. Appl. No. 11/238,991—Mar. 24, 2009 PTO Office Action.
U.S. Appl. No. 11/243,477—Apr. 25, 2008 PTO Office Action.
U.S. Appl. No. 11/243,477—Oct. 24, 2008 Response to PTO Office Action of Apr. 25, 2008.
U.S. Appl. No. 11/243,477—Jan. 7, 2009 PTO Office Action.
U.S. Appl. No. 11/325,448—Jun. 16, 2008 PTO Office Action.
U.S. Appl. No. 11/325,448—Dec. 16, 2008 Response to PTO Office Action of Jun. 16, 2008.
U.S. Appl. No. 11/325,534—Jun. 11, 2008 PTO Office Action.
U.S. Appl. No. 11/325,534—Oct. 15, 2008 Response to PTO Office Action of Jun. 11, 2008.
U.S. Appl. No. 11/353,208—Jan. 15, 2008 PTO Office Action.

U.S. Appl. No. 11/353,208—Mar. 17, 2008 PTO Office Action.
U.S. Appl. No. 11/353,208—Sep. 15, 2008 Response to PTO Office Action of Mar. 17, 2008.
U.S. Appl. No. 11/353,208—Dec. 24, 2008 PTO Office Action.
U.S. Appl. No. 11/353,208—Dec. 30, 2008 Response to PTO Office Action of Dec. 24, 2008.
U.S. Appl. No. 11/400,280—Oct. 16, 2008 PTO Office Action.
U.S. Appl. No. 11/400,280—Oct. 24, 2008 Response to PTO Office Action of Oct. 16, 2008.
U.S. Appl. No. 11/410,905—Sep. 26, 2008 PTO Office Action.
U.S. Appl. No. 11/410,905—Mar. 26, 2009 Response to PTO Office Action of Sep. 26, 2008.
U.S. Appl. No. 11/410,924—Mar. 6, 2009 PTO Office Action.
U.S. Appl. No. 11/411,120—Mar. 19, 2009 PTO Office Action.
U.S. Appl. No. 11/411,129—Jan. 16, 2009 Office Action.
U.S. Appl. No. 11/411,130—May 1, 2008 PTO Office Action.
U.S. Appl. No. 11/411,130—Oct. 29, 2008 Response to PTO Office Action of May 1, 2008.
U.S. Appl. No. 11/417,129—Jul. 11, 2007 PTO Office Action.
U.S. Appl. No. 11/417,129—Dec. 17, 2007 Response to PTO Office Action of Jul. 11, 2007.
U.S. Appl. No. 11/417,129—Dec. 20, 2007 Response to PTO Office Action of Jul. 11, 2007.
U.S. Appl. No. 11/417,129—Apr. 17, 2008 PTO Office Action.
U.S. Appl. No. 11/417,129—Jun. 19, 2008 Response to PTO Office Action of Apr. 17, 2008.
U.S. Appl. No. 11/418,079—Apr. 11, 2008 PTO Office Action.
U.S. Appl. No. 11/418,079—Oct. 7, 2008 Response to PTO Office Action of Apr. 11, 2008.
U.S. Appl. No. 11/418,079—Feb. 12, 2009 PTO Office Action.
U.S. Appl. No. 11/418,080—Mar. 18, 2009 PTO Office Action.
U.S. Appl. No. 11/418,082—Jan. 17, 2007 PTO Office Action.
U.S. Appl. No. 11/418,083—Jun. 20, 2008-2008 PTO Office Action.
U.S. Appl. No. 11/418,083—Dec. 18, 2008 Response to PTO Office Action of Jun. 20, 2008.
U.S. Appl. No. 11/418,084—Nov. 5, 2007 PTO Office Action.
U.S. Appl. No. 11/418,084—May 5, 2008 Response to PTO Office Action of Nov. 5, 2007.
U.S. Appl. No. 11/418,084—Aug. 19, 2008 PTO Office Action.
U.S. Appl. No. 11/418,084—Feb. 19, 2008 Response to PTO Office Action of Aug. 19, 2008.
U.S. Appl. No. 11/418,085—Aug. 10, 2007 PTO Office Action.
U.S. Appl. No. 11/418,085—Nov. 13, 2007 Response to PTO Office Action of Aug. 10, 2007.
U.S. Appl. No. 11/418,085—Feb. 12, 2008 PTO Office Action.
U.S. Appl. No. 11/418,085—Aug. 12, 2008 Response to PTO Office Action of Feb. 12, 2008.
U.S. Appl. No. 11/418,085—Sep. 16, 2008 PTO Office Action.
U.S. Appl. No. 11/418,085—Mar. 6, 2009 Response to PTO Office Action of Sep. 16, 2008.
U.S. Appl. No. 11/418,087—Dec. 29, 2006 Response to PTO Office Action of Dec. 4, 2006.
U.S. Appl. No. 11/418,087—Feb. 15, 2007 PTO Office Action.
U.S. Appl. No. 11/418,087—Mar. 6, 2007 Response to PTO Office Action of Feb. 15, 2007.
U.S. Appl. No. 11/418,088—Jun. 9, 2008 PTO Office Action.
U.S. Appl. No. 11/418,088—Dec. 8, 2008 Response to PTO Office Action of Jun. 9, 2008.
U.S. Appl. No. 11/418,089—Mar. 21, 2008 PTO Office Action.
U.S. Appl. No. 11/418,089—Jun. 23, 2008 Response to PTO Office Action of Mar. 21, 2008.
U.S. Appl. No. 11/418,089—Sep. 30, 2008 PTO Office Action.
U.S. Appl. No. 11/418,089—Mar. 30, 2009 Response to PTO Office Action of Sep. 30, 2008.
U.S. Appl. No. 11/418,091—Jul. 30, 2007 PTO Office Action.
U.S. Appl. No. 11/418,091—Nov. 27, 2007 Response to PTO Office Action of Jul. 30, 2007.
U.S. Appl. No. 11/418,091—Feb. 26, 2008 PTO Office Action.
U.S. Appl. No. 11/418,097—Jun. 2, 2008 PTO Office Action.
U.S. Appl. No. 11/418,097—Dec. 2, 2008 Response to PTO Office Action of Jun. 2, 2008.
U.S. Appl. No. 11/418,097—Feb. 18, 2009 PTO Office Action.
U.S. Appl. No. 11/418,099—Jun. 23, 2008 PTO Office Action.
U.S. Appl. No. 11/418,099—Dec. 23, 2008 Response to PTO Office Action of Jun. 23, 2008.
U.S. Appl. No. 11/418,100—Jan. 12, 2009 PTO Office Action.
U.S. Appl. No. 11/418,123—Apr. 25, 2008 PTO Office Action.
U.S. Appl. No. 11/418,123—Oct. 27, 2008 Response to PTO Office Action of Apr. 25, 2008.
U.S. Appl. No. 11/418,123—Jan. 26, 2009 PTO Office Action.
U.S. Appl. No. 11/418,124—Oct. 1, 2008 PTO Office Action.
U.S. Appl. No. 11/418,124—Feb. 2, 2009 Response to PTO Office Action of Oct. 1, 2008.
U.S. Appl. No. 11/418,124—Mar. 13, 2009 PTO Office Action.
U.S. Appl. No. 11/418,126—Oct. 12, 2006 PTO Office Action.
U.S. Appl. No. 11/418,126—Feb. 12, 2007 Response to PTO Office Action of Oct. 12, 2006 (Redacted).
U.S. Appl. No. 11/418,126—Jun. 6, 2007 PTO Office Action.
U.S. Appl. No. 11/418,126—Aug. 6, 2007 Response to PTO Office Action of Jun. 6, 2007.
U.S. Appl. No. 11/418,126—Nov. 2, 2007 PTO Office Action.
U.S. Appl. No. 11/418,126—Feb. 22, 2008 Response to PTO Office Action of Nov. 2, 2007.
U.S. Appl. No. 11/418,126—Jun. 10, 2008 PTO Office Action.
U.S. Appl. No. 11/418,127—Apr. 2, 2009 Office Action.
U.S. Appl. No. 11/418,128—Dec. 16, 2008 PTO Office Action.
U.S. Appl. No. 11/418,128—Dec. 31, 2008 Response to PTO Office Action of Dec. 16, 2008.
U.S. Appl. No. 11/418,128—Feb. 17, 2009 PTO Office Action.
U.S. Appl. No. 11/418,129—Dec. 16, 2008 Office Action.
U.S. Appl. No. 11/418,129—Dec. 31, 2008 Response to PTO Office Action of Dec. 16, 2008.
U.S. Appl. No. 11/418,244—Jul. 1, 2008 PTO Office Action.
U.S. Appl. No. 11/418,244—Nov. 25, 2008 Response to PTO Office Action of Jul. 1, 2008.
U.S. Appl. No. 11/418,263—Sep. 24, 2008 PTO Office Action.
U.S. Appl. No. 11/418,263—Dec. 24, 2008 Response to PTO Office Action of Sep. 24, 2008.
U.S. Appl. No. 11/418,263—Mar. 9, 2009 PTO Office Action.
U.S. Appl. No. 11/418,315—Mar. 31, 2008 PTO Office Action.
U.S. Appl. No. 11/418,318—Mar. 31, 2009 PTO Office Action.
U.S. Appl. No. 11/441,219—Jan. 7, 2009 PTO Office Action.
U.S. Appl. No. 11/522,929—Oct. 22, 2007 PTO Office Action.
U.S. Appl. No. 11/522,929—Feb. 21, 2008 Response to PTO Office Action of Oct. 22, 2007.
U.S. Appl. No. 11/641,678—Jul. 22, 2008 PTO Office Action.
U.S. Appl. No. 11/641,678—Jan. 22, 2009 Response to Office Action of Jul. 22, 2008.
U.S. Appl. No. 11/711,000—Mar. 6, 2009 PTO Office Action.
U.S. Appl. No. 11/716,552—Feb. 12, 2009 Response to PTO Office Action of Feb. 9, 2009.
U.S. Appl. No. 11/716,552—Jul. 3, 2008 PTO Office Action.
Walsh, J.E., et al., 1999. From website: http://www.ieee.org/organizations/pubs/newsletters/leos/feb99/hot2.htm.
Wentworth, Stuart M. et al., "Far-Infrared Composite Microbolometers," IEEE MTT-S Digest, 1990, pp. 1309-1310.
Yamamoto, N. et al., "Photon Emission From Silver Particles Induced by a High-Energy Electron Beam," Physical Review B, Nov. 6, 2001, pp. 205419-1-205419-9, vol. 64, The American Physical Society.
Yokoo, K. et al., "Smith-Purcell Radiation at Optical Wavelength Using a Field-Emitter Array," Technical Digest of IVMC, 2003, pp. 77-78.
Zeng, Yuxiao et al., "Processing and encapsulation of silver patterns by using reactive ion etch and ammonia anneal," Materials Chemistry and Physics 66, 2000, pp. 77-82.
"Notice of Allowability" mailed on Jul. 2, 2009 in U.S. Appl. No. 11/410,905, filed Apr. 26, 2006.
"Notice of Allowability" mailed on Jun. 30, 2009 in U.S. Appl. No. 11/418,084, filed May 5, 2006.
B. B Loechel et al., "Fabrication of Magnetic Microstructures by Using Thick Layer Resists", Microelectronics Eng., vol. 21, pp. 463-466 (1993).
Magellan 8500 Scanner Product Reference Guide, PSC Inc., 2004, pp. 6-27—F18.

Magellan 9500 with SmartSentry Quick Reference Guide, PSC Inc., 2004.

Response to Non-Final Office Action submitted May 13, 2009 in U.S. Appl. No. 11/203,407.

U.S. Appl. No. 11/238,991—May 11, 2009 PTO Office Action.

U.S. Appl. No. 11/350,812—Apr. 17, 2009 Office Action.

U.S. Appl. No. 11/411,130—Jun. 23, 2009 PTO Office Action.

U.S. Appl. No. 11/418,096—Jun. 23, 2009 PTO Office Action.

U.S. Appl. No. 11/433,486—Jun. 19, 2009 PTO Office Action.

Brau et al., "Tribute to John E Walsh", Nuclear Instruments and Methods in Physics Research Section A. Accelerators, Spectrometers, Detectors and Associated Equipment, vol. 475, Issues 1-3, Dec. 21, 2001, pp. xiii-xiv.

Kapp, et al., "Modification of a scanning electron microscope to produce Smith—Purcell radiation", Rev. Sci. Instrum. 75, 4732 (2004).

Scherer et al. "Photonic Crystals for Confining, Guiding, and Emitting Light", IEEE Transactions on Nanotechnology, vol. 1, No. 1, Mar. 2002, pp. 4-11.

U.S. Appl. No. 11/203,407—Jul. 17, 2009 PTO Office Action.

U.S. Appl. No. 11/418,089—Jul. 15, 2009 PTO Office Action.

U.S. Appl. No. 11/418,097—Sep. 16, 2009 PTO Office Action.

U.S. Appl. No. 11/418,123—Aug. 11, 2009 PTO Office Action.

U.S. Appl. No. 11/418,365—Jul. 23, 2009 PTO Office Action.

U.S. Appl. No. 11/441,240—Aug. 31, 2009 PTO Office Action.

Urata et al., "Superradiant Smith-Purcell Emission", Phys. Rev. Lett. 80, 516-519 (1998).

Sadwick, Larry et al., "Microfabricated next-generation milimeter-wave power amplifiers," www.rfdesign.com, Feb. 2004.

Saraph, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.

* cited by examiner

DEPRESSED ANODE WITH PLASMON-ENABLED DEVICES SUCH AS ULTRA-SMALL RESONANT STRUCTURES

CROSS-REFERENCE TO RELATED APPLICATIONS

This application claims priority to U.S. Provisional Patent Application No. 60/960,694, filed Oct. 10, 2007, the entire contents of which are incorporated herein by reference.

As introductory information, the following related applications are incorporated herein by reference:

1. U.S. application Ser. No. 11/418,099 filed May 5, 2006 entitled "Surface Plasmon Signal Transmission";
2. U.S. application Ser. No. 11/418,084 filed May 5, 2006 entitled "Detecting Plasmons Using a Metallurgical Junction";
3. U.S. application Ser. No. 11/411,130 filed Apr. 26, 2006 entitled "Charged Particle Acceleration Apparatus and Method";
4. U.S. application Ser. No. 11/418,294 filed May 5, 2006 entitled "Electron Accelerator for Ultra-Small Resonant Structures";
5. U.S. application Ser. No. 11/243,476 filed Oct. 5, 2005 entitled "Structures and Methods for Coupling Energy from an Electromagnetic Wave," which is now U.S. Pat. No. 7,253,426 issued Aug. 7, 2007;
6. U.S. application Ser. No. 11/203,407 filed Aug. 15, 2007 entitled "Method of Patterning Ultra-Small Structures";
7. U.S. application Ser. No. 10/917,511 filed Aug. 13, 2004 entitled "Patterning Thin Metal Films by Dry Ion Etching," which is now abandoned.

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

FIELD OF THE DISCLOSURE

This relates to couplers for electromagnetic energy, in particular couplers of energy from an electron beam into a Plasmon-enabled device.

INTRODUCTION

Electromagnetic radiation is produced by the motion of electrically charged particles. Oscillating electrons produce electromagnetic radiation commensurate in frequency with the frequency of the oscillations. Electromagnetic radiation is essentially energy transmitted through space or through a material medium in the form of electromagnetic waves. The term can also refer to the emission and propagation of such energy. Whenever an electric charge oscillates or is accelerated, a disturbance characterized by the existence of electric and magnetic fields propagates outward from it. This disturbance is called an electromagnetic wave. Electromagnetic radiation falls into categories of wave types depending upon their frequency, and the frequency range of such waves is tremendous, as is shown by the electromagnetic spectrum in the following chart (which categorizes waves into types depending upon their frequency):

| Type | Approx. Frequency |
|---|---|
| Radio | Less than 3 Gigahertz |
| Microwave | 3 Gigahertz-300 Gigahertz |
| Infrared | 300 Gigahertz-400 Terahertz |
| Visible | 400 Terahertz-750 Terahertz |
| UV | 750 Terahertz-30 Petahertz |
| X-ray | 30 Petahertz-30 Exahertz |
| Gamma-ray | Greater than 30 Exahertz |

The ability to generate (or detect) electromagnetic radiation of a particular type (e.g., radio, microwave, etc.) depends upon the ability to create a structure suitable for electron oscillation or excitation at the frequency desired. Electromagnetic radiation at radio frequencies, for example, is relatively easy to generate using relatively large or even somewhat small structures.

Electromagnetic Wave Generation

There are many traditional ways to produce high-frequency radiation in ranges at and above the visible spectrum, for example, up to high hundreds of Terahertz. There are also many traditional and anticipated applications that use such high frequency radiation. As frequencies increase, however, the kinds of structures needed to create the electromagnetic radiation at a desired frequency become generally smaller and harder to manufacture. U.S. application Ser. No. 11/243,476 (commonly owned) described ultra-small-scale devices that obtain multiple different frequencies of radiation from the same operative layer.

Resonant structures have been the basis for much of the presently known high frequency electronics. Devices like klystrons and magnetrons had electronics that moved frequencies of emission up to the megahertz range by the 1930s and 1940s. By around 1960, people were trying to reduce the size of resonant structures to get even higher frequencies, but had limited success because the Q of the devices went down due to the resistivity of the walls of the resonant structures. At about the same time, Smith and Purcell saw the first signs that free electrons could cause the emission of electromagnetic radiation in the visible range by running an electron beam past a diffraction grating. Since then, there has been much speculation as to what the physical basis for the Smith-Purcell radiation really is.

U.S. application Ser. No. 11/243,476 showed that some of the Plasmon theory of resonant structures applied to certain nano-structures. It was assumed that at high enough frequencies, Plasmons would conduct the energy as opposed to the bulk transport of electrons in the material, so the electrical resistance would decrease to the point where resonance could effectively occur again, and make the devices efficient enough to be commercially viable.

Those resonant structures were put to use in a Plasmon coupler described in U.S. application Ser. No. 11/418,099 (commonly owned). A Plasmon is the quasi-particle resulting from the quantization of plasma oscillations. Scanning near-field microscopes that put a Plasmon on a wire are known. The possibility of getting data encoded onto Plasmons has been discussed. U.S. application Ser. No. 11/418,099 described an improved structure that could couple high-speed signals with the advantages of an optical system and yet employ the metal structures commonly used on microcircuits. In an example of such a structure, Plasmons were stimulated to carry a signal to a first portion of the structure. The Plasmons were coupled to a second portion of the structure carrying the signal and then the signal was coupled off the structure.

Generally, a structure and method for coupling a high-speed signal on a device, carrying the signal through the device using Plasmons, and then coupling the signal from the device was described in U.S. application Ser. No. 11/418,099. Energy was modulated by the signal coupled to a source. At least a portion of the energy was typically coupled to a first portion of the device. Plasmons having fields were stimulated on the first portion as a function of the modulated energy. The energy from the source included a charged particle beam or an electromagnetic wave. The electromagnetic wave had a frequency range from about 0.1 terahertz (THz) (3000 microns) to about 7 petahertz (PHz) (0.4 nanometers), referred to as the terahertz portion of the electromagnetic spectrum. The Plasmons having fields, modulated to carry the signal, were coupled to a second portion of the device. In one embodiment, an electromagnetic wave carrying the signal was generated on the second portion and coupled from the device. In another embodiment, a charged particle beam was directed to travel past or through intensified fields on the second portion. The charged particle beam was then modulated by the intensified fields and coupled the signal off the device.

FIG. 1 is an enlarged top-view illustrating the coupling of a signal onto, through, and off a structure or device 100 using Plasmons 108. The signal comprises input signal 105A and output signal 105B, which are coupled onto and off the device 100, respectively. Preferably, input signal 105A will be transmitted through device 100 and will be output identically as output signal 105B, although loses or other modifications may occur to signal 105A (either passively or intentionally) before the input signal 105A is output as output signal 105B. Further, the signal through the device 100 is referred to as the input signal 105A. Microcircuits typically include a conducting layer disposed between the dielectric layers. The device 100 is typically formed within cavities between the dielectric layers of a microcircuit. Dielectric substrate is a base dielectric layer on which the device 100 is formed. A microcircuit can be formed by using selective etch techniques well known in the semiconductor industry. For example, a selective etchant such as a hydrofluoric (HF) acid solution can remove phosphosilicate glass used for portions of the dielectric layers. The dielectric layers can include low-κ materials such as various SiLK type materials, silicon dioxide, silicon nitride, various TEOS type materials, phosphosilicate glass and the like.

Transmitting structure 103 and receiving structure 104 are formed on the substrate, but can also be formed on transmission line 102. The transmission line 102 generally is made out of a portion of the microcircuit conducting layer between and adjacent to transmitting structure 103 and the receiving structure 104. The transmission line 102 couples Plasmons 108 and the fields associated with the Plasmons 108 between the transmitting structure 103 and receiving structure 104. In another embodiment (not shown), the transmission line connects between cavities formed within a microcircuit to couple Plasmons between various structures.

The transmission line 102 can be made, e.g., using materials such as a strip of metal or metallization. Generally, the better the electrical conductivity of the material making up the transmission line 102, the stronger the transmission line 102 will conduct the Plasmons 108. Typically, the transmission line 102 is made using materials such as gold (Au), silver (Ag), copper (Cu) and aluminum (Al). Those skilled in the art will realize and understand, upon reading this description, that other and/or different metals may be used. In another embodiment (not shown), the transmission line 102 includes a metal cladding or plating. Other materials may be used for applications in different carrier frequency regimes. Further, the performance of the transmission line 102 can be enhanced by using materials having a low percentage of impurities and a low frequency of grain boundaries.

The transmitting structure 103, as shown in FIG. 1, is connected to an input end of the transmission line 102. The transmitting structure 103 can include resonant, sub-wavelength and wavelength structures and can be sized to a multiple of the wavelength. The shape of the transmitting structure 103 can be, e.g., spherical, cubical, triangular-pyramidal and the like. Even though the transmitting structure 103 is shown as generally cubical, this should not be considered limiting. The transmitting structure 103 can be formed, e.g., using the methods as described in the applications referenced in above.

The Plasmons 108 can include bulk Plasmons and surface Plasmons. Plasmons, generally and particularly surface Plasmons, are plasma oscillations or charge density waves confined to a surface of a metal. A strong interaction with Plasmons can include using metals having a plasma frequency covering at least a portion of the optical and/or terahertz spectrum, depending on the application frequency. The plasma frequency is dependent upon the type of material used. For example, the plasma frequency of silver includes a range from the visible portion of the electromagnetic spectrum to the infrared. Hence, there is a strong interaction between silver and an electromagnetic wave between the visible and infrared portion of the electromagnetic spectrum. In general, the selection of the material depends on the required operating frequency of the device 100. For the visible portion of the electromagnetic spectrum, the surface of the transmitting structure 103 can preferably be made using materials such as gold, silver, copper, aluminum and the like. A structure made including at least these materials and having an appropriate size and shape can resonant for a given frequency or range of frequencies. This is referred to as Plasmon resonance.

As shown in FIG. 1, the receiving structure 104 is connected to an output end of the transmission line 102. The surface of the receiving structure 104 can be made using the same materials as used to make the surface of the transmitting structure 103. The size, shape and method of making the receiving structure 104 are generally similar to those of the transmitting structure 103. The surfaces of the transmitting structure 103, receiving structure 104, and transmission line 102 are normally made of materials having a strong interaction with Plasmons at the frequency of operation of the device 100.

FIG. 1 illustrates the use of Plasmons 108 for coupling the input signal 105A and output signal 105B, respectively on and off the device 100. Cavities (denoted C1 and C2 in the drawings) are shown formed in the transmitting structure 103 and receiving structure 104, respectively. The cavities can be formed using the techniques as described in the applications referenced above.

As shown in FIG. 1, an energy source 109 is disposed on the substrate and provides a charged particle beam. As noted in the related applications, the particle beam may comprise any charged particles (such as, e.g., positive ions, negative ions, electrons, and protons and the like) and the source of charged particles may be any desired source of charged particles such as an ion gun, a thermionic filament, tungsten filament, a cathode, a vacuum triode, a planar vacuum triode, an electron-impact ionizer, a laser ionizer, a field emission cathode, a chemical ionizer, a thermal ionizer, an ion-impact ionizer, an electron source from a scanning electron microscope, etc. The type of particles provided by the source 109 is not limiting. Further, the source 109 can include plates or the like (not shown) for establishing an electric field that controls a path of the particle beam 107.

For the purposes of this description, the charged particle source 109 can include an electron gun, and the charged particle beam is sometimes referred to as an electron or particle beam 107.

The input signal 105A containing data can be coupled to the source 109 and encoded or modulated onto the particle beam 107. The method for modulating the charged particle beam 107 includes pulsing the particle beam 107 on and off. Further, the charged particle beam 107 can be modulated using techniques such as velocity and angular modulation. Velocity and angular modulation are described in related patent application Ser. No. 11/238,991, filed Sep. 30, 2005, entitled "Light Emitting Free Electron Micro-resonant Structure" and No. 11/243,476, filed Oct. 5, 2005, entitled "Structure and Method for Coupling Energy From an Electromagnetic Wave." The method of modulating the charged particle beam 107 is not limiting.

Once modulated, the charged particle beam 107 can be directed along a path between dielectric layers of a microcircuit and adjacent to the cavity C1 of the transmitting structure 103. The path can be generally straight, but is not required to be so. The cavity C1 of the transmitting structure 103 is preferably evacuated to a vacuum having a permittivity of about one. Fields are generated from the particle beam 107 and comprise energy in the form of electromagnetic, electric and/or magnetic fields. At least a portion of the energy 106A is coupled across the cavity C1 of the receiving structure 103 and received on the surface adjacent to the cavity. This provides a medium change for the coupled fields, because the permittivity or dielectric transitions from the cavity of the transmitting structure 103 (e.g., a vacuum) to the surface, which is metal. The gap across the cavity C1 can be sized to optimize the coupling of energy from the fields to the surface inside the cavity. The fields are modulated in accordance with the input signal 105A encoded onto the particle beam 107. The interaction between the fields and the surface, or free-electrons on the surface of the transmitting structure 103, causes a stimulation of the Plasmons 108. This stimulation of the Plasmons 108 is a function of the modulation of the fields and can include a resonant mode. The Plasmons 108 are stimulated and modulated as a function of the input signal 105A.

The three arrows that are used in the drawings to represent Plasmons 108 also indicate the general direction of travel of the Plasmons 108. The energy distribution of Plasmons 108 can be depicted as sinusoidal wave patterns, but the energy distribution of the Plasmons 108 is not limited to a particular function. Even though the Plasmons 108 are shown at particular locations in the drawings, those skilled in the art will realize and understand, upon reading this description, that the Plasmons 108 generally can occur throughout the transmitting structure 103, the transmission line 102 and the receiving structure 104, and their specific locations are not limiting.

Modulated fields are generated upon the modulated stimulation of the Plasmons 108. The depiction of the Plasmons is not intended to be limiting in any way, e.g., such as to the location and the like.

Still referring to FIG. 1, the Plasmons 108 having fields are coupled to or further stimulated on the input end of the transmission line 102. The Plasmons 108 are coupled along the transmission line 102 from the transmitting structure 103 and carry the input signal 105A. Plasmons 108 having fields are coupled or further stimulated on the receiving structure 104.

The cavity C2 of the receiving structure 104 can be sized to the resonant wavelength, sub-wavelength and multiple wavelengths of the energy. The fields can be intensified by using features on the receiving structure 104 such as the cavity. A portion of the fields are coupled across the cavity of the receiving structure 104 and are intensified and is referred to as portion fields. This can result in accelerating charges on the surface adjacent to the cavity. Further, the portion fields include a time-varying electric field component across the cavity. Thus, similar to an antenna, a modulated electromagnetic wave is generated and emitted from the cavity C2. Hence, the portion fields 106B modulate energy or the electromagnetic wave and couple the output signal 105B off the device 100. Further, by sizing the receiving structure 104 and the cavity of the receiving structure 104 to resonate at a particular wavelength, the frequency of the modulated electromagnetic wave carrying the signal 105B can be established.

A channel can be formed through a wall of a cavity of a microcircuit to couple the electromagnetic wave carrying the output signal 105B from the device 100. For example, the channel can be made using a dielectric material having a greater index of refraction than the material of dielectric layer. Hence, the output signal 105B is coupled from the structure or device 100.

The transmitting structure 103 and receiving structure 104 including their respective cavities C1 and C2 are in a category of devices referred to herein as "ultra-small resonant structures."

As used herein, an ultra-small resonant structure can be any structure with a physical dimension less than the wavelength of microwave radiation, which (1) emits radiation (in the case of a transmitter) at a microwave frequency or higher when operationally coupled to a charge particle source or (2) resonates (in the case of a detector/receiver) in the presence of electromagnetic radiation at microwave frequencies or higher.

Methods of making the above-described device for detecting an electromagnetic wave as can be employed herein may use the techniques included under U.S. application Ser. No. 10/917,571, filed on Aug. 13, 2004, entitled "Patterning Thin Metal Film by Dry Reactive Ion Etching" and/or U.S. application Ser. No. 11/203,407, filed Aug. 15, 2005, entitled "Method of Patterning Ultra-Small Structures," each of which is commonly owned at the time of filing, the entire contents of each of which are incorporated herein by reference. Other manufacturing techniques may also be used.

The related applications described a number of different inventions involving these novel ultra-small resonant structures and methods of making and utilizing them. In essence, the ultra-small resonant structures emitted electromagnetic radiation at frequencies (including but not limited to visible light frequencies) not previously obtainable with characteristic structures nor by the traditional operational principles. In some of those applications of these ultra-small resonant structures, resonance was electron beam-induced. In such embodiments, the electron beam passed proximate to an ultra-small resonant structure—sometimes a resonant cavity—causing the resonant structure to emit electromagnetic radiation; or in the reverse, incident electromagnetic radiation proximate the resonant structure caused physical effects on the proximate electron beam.

Thus, the resonant structures in some embodiments depended upon a coupled, proximate electron (or other charged particle) beam. The charge density and velocity of that electron beam could have some effects on the response returned by the resonant structure. For example, in some cases, the properties of the electron beam could affect the intensity of electromagnetic radiation. In other cases, it could affect the frequency of the emission.

As a general matter, electron beam accelerators were not new, but they were new in the context of the affect that beam acceleration had on the novel ultra-small resonant structures. By controlling the electron beam velocity, valuable characteristics of the ultra-small resonant structures were accommodated.

Also, the related cases described how the ultra-small resonant structures could be accommodated on integrated chips. One unfortunate side effect of such a placement was the location of a relatively high-powered cathode on or near the integrated chip. For example, in some instances, a power source of 100s or 1000s eV will produce desirable resonance effects on the chip (such applications may—but need not—include intra-chip communications, inter-chip communications, visible light emission, other frequency emission, electromagnetic resonance detection, display operation, etc.) Putting such a power source on-chip was disadvantageous from the standpoint of its potential affect on the other chip components although it is highly advantageous for operation of the ultra-small resonant structures.

U.S. application Ser. No. 11/418,294 (commonly owned) described a system that allowed the electrons to gain the benefit usually derived from high-powered electron sources, without actually placing a high-powered electron source on-chip.

FIG. 2, taken from U.S. application Ser. No. 11/418,294, shows an example of an example electron beam used in conjunction with ultra-small resonant structures. Transmitter 10 included ultra-small resonant structures 12 that emitted encoded light 15 when an electron beam 11 passed proximate to them. Such ultra-small resonant structures could be one or more of those described in U.S. patent application Ser. Nos. 11/238,991; 11/243,476; 11/243,477; 11/325,448; 11/325,432; 11/302,471; 11/325,571; 11/325,534; 11/349,963; and/or 11/353,208. The resonant structures in the transmitter could be manufactured in accordance with any of U.S. application Ser. Nos. 10/917,511; 11/350,812; or 11/203,407 or in other ways. Their sizes and dimensions could be selected in accordance with the principles described in those and the other above-identified applications and, for the sake of brevity, will not be repeated herein. The contents of the applications described above are assumed to be known to the reader.

The ultra-small resonant structures had one or more physical dimensions that were smaller than the wavelength of the electromagnetic radiation emitted (in the case of FIG. 2, encoded light 15, but in other embodiments, the radiation can have microwave frequencies or higher). The ultra-small resonant structures operated under vacuum conditions. In such an environment, as the electron beam 11 passed proximate the resonant structures 12, it caused the resonant structures to resonate and emit the desired encoded light 15. The light 15 was encoded by the electron beam 11 via operation of the cathode 13 by the power switch 17 and data encoder 14.

In the transmitter 10, if an electron acceleration level normally developed under a 4000 eV power source (a number chosen solely for illustration, and could be any energy level whatsoever desired) was desired, the respective anodes connected to the Power Switch 17 at Positions A-H were each given a potential relative to the cathode of 1/n times the desired power level, where n was the number of anodes in the series. Any number of anodes could have been used. In the case of FIG. 2, eight anodes were present. In the example identified above, the potential between each anode and the cathode 13 was 4000V/8=500V per anode.

The Power switch 13 then required only a 500V potential relative to ground because each anode only required 500V, which was an advantageously lower potential on the chip than 4000V.

In the system without multiple anodes, the 500V potential on a single anode would not accelerate the electron beam 11 at nearly the same level as provided by the 4000V source. But, the system of FIG. 2 obtained the same level of acceleration as the 4000V using multiple anodes and careful selection of the anodes at the much lower 500V voltage. In operation, the anodes at Positions A-H turned off as the electron beam passed by, causing the electron beam to accelerate toward the next sequential anode. Once the electron beam reached at or near the anode at Position A, the Position A anode turned OFF and the Position B anode turned ON causing the electron beam passing Position A to further accelerate toward Position B. When it reached at or near Position B, the Position B anode turned off and the Position C anode turned ON. The process of turning sequential anodes ON continued as the electron beam reached at or near each sequential anode position.

After passing Position H in the transmitter 10 of FIG. 2, the electron beam had accelerated to essentially the same level as it would have if only one high voltage anode had been present.

The anodes in transmitter 10 were thus turned ON and OFF as the electron beam reached the respective anodes. One way (although not the only way) that the system could know when the electron beam was approaching the respective anodes was to provide controller 16 to sense when an induced current appears on the respective anode caused by the approaching electron beam.

After the electron beam had accelerated to each sequential anode 10, the accelerated electron beam 11 can then pass the resonant structures 12, causing them to emit the electromagnetic radiation encoded by the data encoder 14. The resonant structures 12/24 were shown generically and on only one side, but they could have been any of the ultra-small resonant structure forms and could have been on both sides of the electron beam. Collector 18 can receive the electron beam and either use the power associated with it for on-chip power or take it to ground.

The Receiver 20 in FIG. 1 received the encoded light 15 and at the resonant structures 24, which responded to the resonant light by altering a path of the electron beam 25. The receiver 20 had a set of anodes 27 that were evenly spaced. As the electron beam 25 from cathode 23 accelerated, the ON states of the anodes 27 controlled by controller 21 and invoked by power switch 22 at the Positions A-H were shortened as the electron beam approached the resonant structures 24 (i.e., as the electron beam continued to accelerate).

To excite most Plasmon-enabled devices it is efficient to use an electron beam that is traveling at a high speed, most easily done by accelerating through a high voltage potential, as described above with respect to U.S. application Ser. No. 11/418,294. However, in such cases, not much of the energy from the electron beam is actually transferred to the Plasmon-enabled device. Further, the electron beam must be terminated at a collection point and thus its energy must there either be lost or recovered. The use of a depressed anode solves this problem as little electric current flows though the high voltage anode.

BRIEF DESCRIPTION OF THE DRAWINGS

The following description, given with respect to the attached drawings, may be better understood with reference to the non-limiting examples of the drawings wherein like reference numbers designate like elements.

DETAILED DESCRIPTION OF AN EXAMPLE EMBODIMENT

The ultimate goal of an ultra-small resonant structure system is to induce electromagnetic radiation at a frequency in excess of the microwave frequency (in the case of a transmitter such as transmitter 10) or provide an observable beam change in the present of electromagnetic radiation (in the case of a receiver such as receiver 20). This is done by coupling the energy from an electron beam into the ultra-small resonant structure while the beam passes proximate to the structure without touching the structure. The energy of the electron beam is ideally (though not practically) delivered entirely into the resonance activity of the ultra-small resonance structure and is spent. In reality, the electron beam is highly powered and remains so even after its usefulness to the energy coupling operation with the ultra-small resonance structure is completed. The energy from the still highly-powered electron beam is either lost after it passes the ultra-small resonance structure or is collected.

Figure 3:
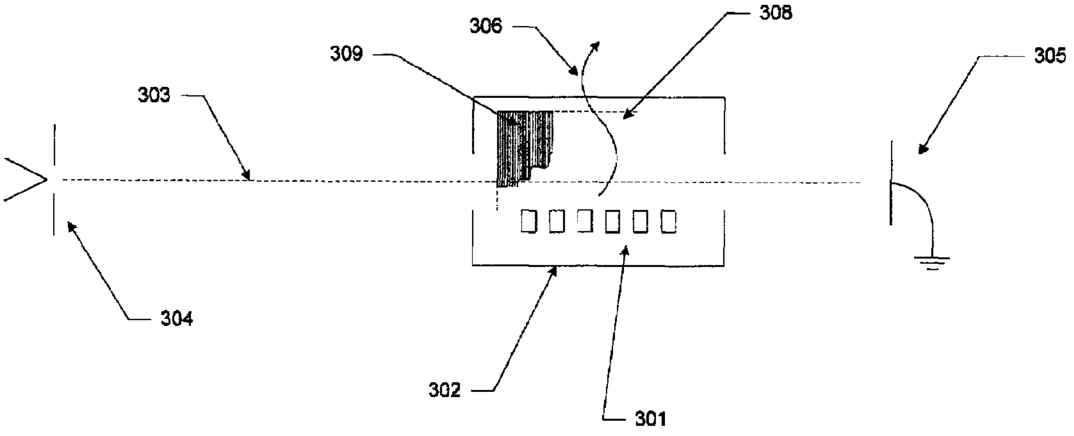
FIG. 3 is a schematic view of an example Plasmon-enabled device.
Figure 4:
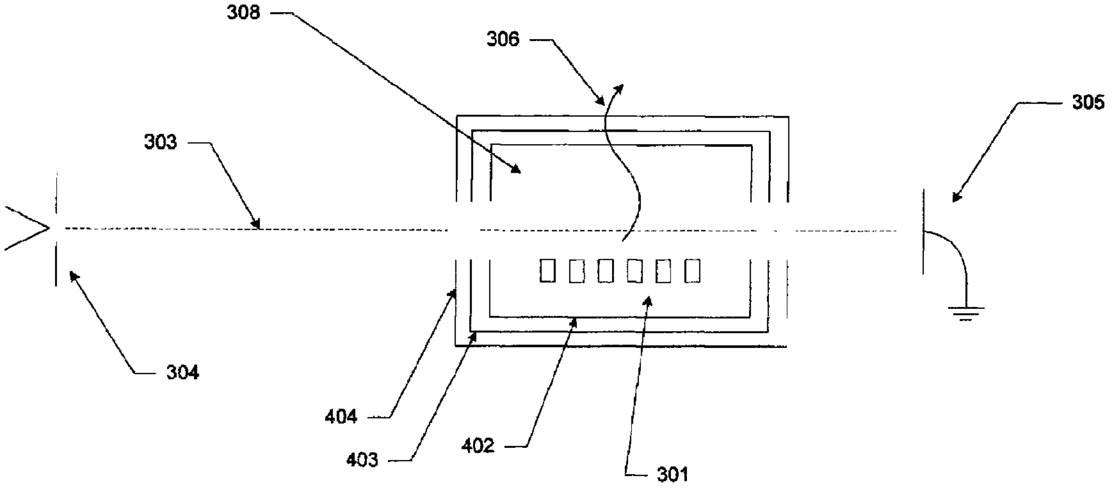
FIG. 4 is a schematic view of another example of a Plasmon-enabled device.

In FIGS. 3 and 4, the electron beam 303 originates at cathode 304 and terminates at an anode 305. In the present environments, it will be a relatively high power level (for example, about several hundred volts to hundreds of thousands of volts). The electron beam 303 normally follows a relatively straight path from the cathode 304 to the anode 305 where it is either collected (not shown) or grounded (shown) and lost. As described above, the present system induces resonance in Plasmon-enabled devices 301 such as ultra-small resonant structures, which thereby emit the EMR at a frequency higher than the microwave frequency (for example, visible light). The present owner has overseen the invention of these first, novel very small structures that resonate to produce EMR at frequencies higher than previously seen from large-scale resonant cavities (such as klystrons and the like).

Figure 1:
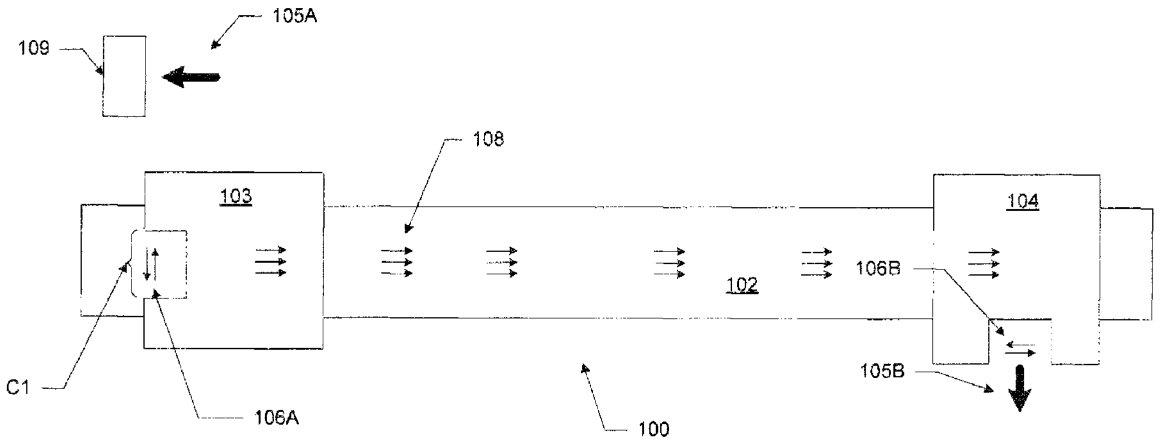
FIG. 1 is an enlarged top-view of a device within a cavity of a microcircuit using Plasmons to carry a signal.
Figure 2:
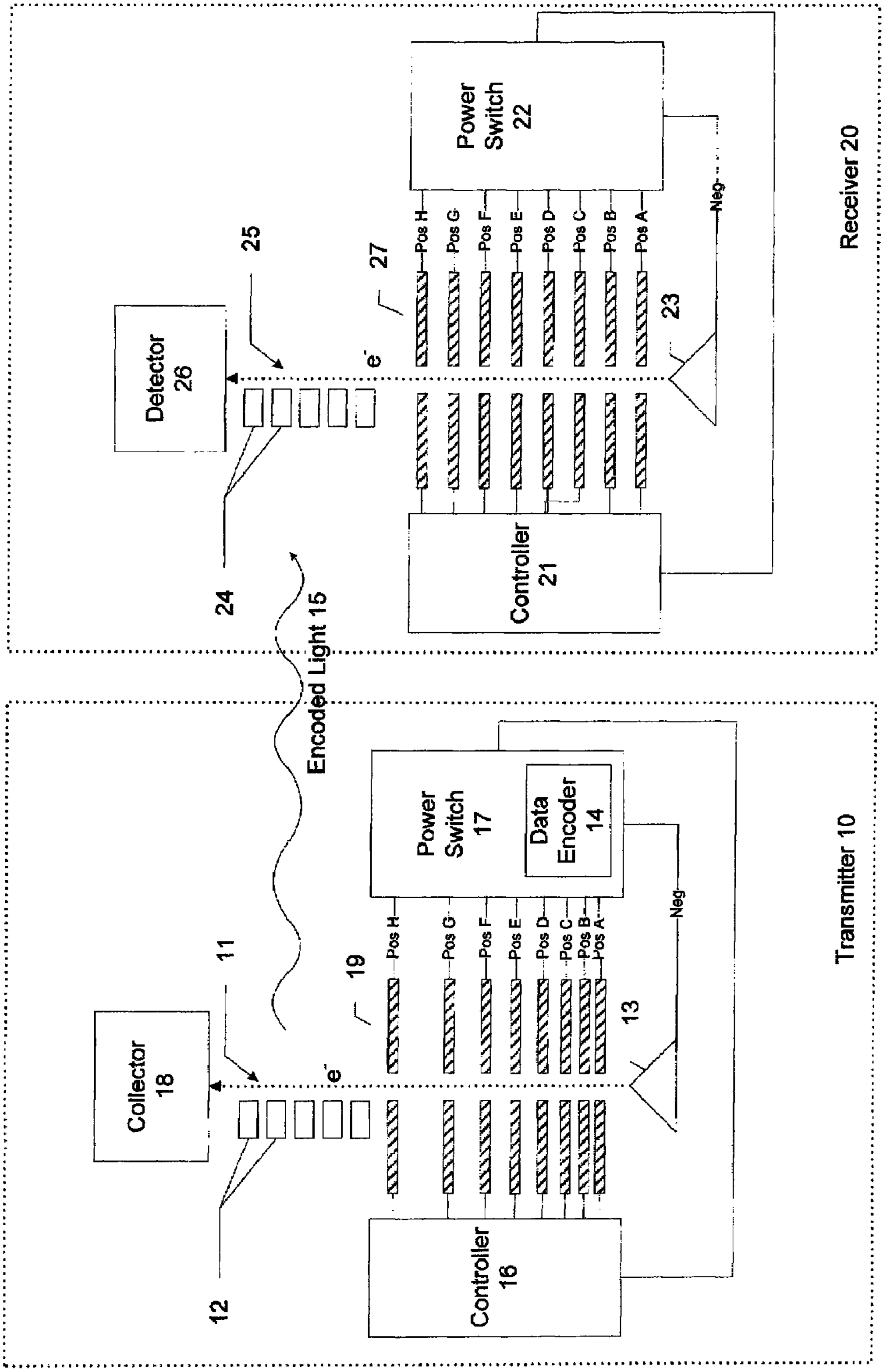
FIG. 2 is a schematic view of a transmitter and detector employing ultra-small resonant structures and two alternative types of electron accelerators.

The electron beam of FIGS. 3 and 4 and its corresponding structures finds its application in systems such as shown in FIGS. 1 and 2. In FIG. 1, for example the electron beam and corresponding cathode and anodes described in more detail below can be substituted for the beam created by the charged particle source 109 in FIG. 1 to obtain the benefits of both the FIG. 1 structure and the FIG. 3 or 4 structures. In FIG. 2, the electron beam of FIGS. 3 and 4 can be substituted for the beam 11 and beam 25 to obtain the benefits of both the FIG. 2 structure and the FIG. 3 or 4 structures.

Of course, the present inventions can be applied to Plasmon-enabled devices 301 other than ultra-small resonant structures, as described in U.S. application Ser. No. 11/418,099 and FIG. 1 above, provided their resonance is induced by a passing electron beam.

In the present embodiment, a depressed anode 302 is arranged so the electron beam 303 passes through/by the depressed anode 302 before reaching the anode 305. In the example of FIG. 3, the depressed anode 302 surrounds the Plasmon-enabled devices 301 but it does not have to. A depressed anode 302 that surrounds the Plasmon-enabled devices includes an opening 308 so the electromagnetic radiation 306 from the Plasmon-enabled devices can be emitted. The ultra-small resonant structures are quite novel because they emit electromagnetic radiation at higher frequencies than the microwave spectrum, which limited prior resonant devices. The devices have tremendously useful applications, for example, in their ability to produce visible light of different frequencies from a single metal layer. In such a case, opening 308 is appropriate to permit the visible light to escape the chamber created by the depressed anode. In some cases, a covering 309 can be used over the opening 308 to allow the electromagnetic radiation to escape. The covering 309 can be a screen, for example, when the electromagnetic radiation is in the visible spectrum. Alternatively, the covering 309 can be made of a conductive transparent material such as indium tin oxide.

Depressed anodes are known for use in high powered microwave tubes for collection of energy from an electron beam. One author suggests that the original thought for depressed anodes may have originated with Oskar Heil as early as 1935. *Historical German Contributions to Physicas and Applications of Electromagnetic Oscillations and Waves*, Manfred Thumm, part 10. The basic idea behind a depressed anode is to depress the voltage from a linear electron beam to a lower voltage without causing the electron beam to lose its attraction to the destination anode. The depression occurs by passing the electron beam 303 past a high negative voltage which reduces the beam energy prior to reaching the destination cathode 305. Ordinarily, the potential energy in the beam 303 that is not coupled to the Plasmon-enabled devices 301 to produce the greater-than-microwave-frequency electromagnetic radiation is converted to heat at the destination anode 305 and lost. With a depressed anode 302 intervening, some of the beam energy that is not coupled to the Plasmon-enable devices can be recaptured before the remainder of the energy is lost to the destination anode 305. Electric circuitry to collect the energy recovered by the depressed anode 302 is normally employed though not shown in FIG. 3.

The use of the depressed anode in FIG. 3 is advantageous in conjunction with, particularly, the ultra-small resonant structures because unlike prior applications employing depressed anodes, the present systems can operate above the microwave frequency and thus can move data in micro-circuit environments not appropriate for microwave transmission. While large scale microwave cavities and tubes don't function well in micro-environments, the present ultra-small resonant structures occupy little microcircuit real estate (having a dimension smaller than the wavelength of its emitted radiation) and are appropriate in frequency for microcircuit environments. The need for high powered beam generators in those environments can be accomplished but is challenging, so the incorporation of depressed anodes with ultra-small resonant structures gives greater access to the microcircuit environment already advantageously-suited for the ultra-small resonant structures.

FIG. 4 illustrates an improvement upon the example of FIG. 3 in which a series of depressed anodes 402, 403 and 404 surround the Plasmon-enabled devices. Each depressed anode has an increasingly higher potential compared to its neighbor so the energy from the electron beam is removed in stages as the beam passes the various depressed anodes 402, 403, and 404. Although three stages are shown, as many stages as desired and practical could be employed. In one example, anode 402 is supplied by a 30 KV supply, anode 403 is supplied by a 20 KV supply, and anode 404 is supplied by a 10 KV supply. Those numbers are merely examples and are no way limiting and the arrangement can be of different voltages so the depressed anodes present a high negative voltage to the electron beam.

While certain configurations of structures have been illustrated for the purposes of presenting the basic structures of the present invention, one of ordinary skill in the art will appreciate that other variations are possible which would still fall within the scope of the appended claims. While the inventions have been described in connection with what is presently considered to be the most practical and preferred embodiment, it is to be understood that the inventions are not to be limited to the disclosed embodiment, but on the contrary, cover various modifications and equivalent arrangements included within the spirit and scope of the appended claims.

What is claimed is:

1. A system, comprising:

a cathode emitting a linear beam of charged particles;

a destination anode at a termination point of the linear beam to couple all energy from the linear beam that arrives at the destination anode;

a depressed anode, upstream of the destination anode, to couple some of the energy from the linear beam; and an ultra-small resonant structure located within the depressed anode and proximate the linear beam, without touching the electron beam, to couple energy from the linear beam, resonate as a result of the coupled energy form the linear beam, and emit electromagnetic radiation as a result of the resonance at a resonance wavelength less than a microwave wavelength, the ultra-small resonant structure having at least one dimension smaller than the resonance wavelength.

2. The system of claim 1, wherein the depressed anode further includes an opening for the electromagnetic radiation emitted by the ultra-small resonant structure to escape.

3. The system of claim 2, wherein the opening is covered by a screen.

4. The system of claim 1, wherein the depressed anode surrounds the ultra-small resonant structure.

5. The system of claim 4, wherein the resonant wavelength is in a visible light spectrum and the depressed anode further includes an opening for the visible light resonant wavelength to escape.

6. A method, comprising the steps of:

(a) creating an electron beam;

(b) after creating the electron beam, directing the electron beam by a depressed anode;

(c) after creating the electron beam, passing the electron beam near an ultra-small resonant structure, without touching the ultra-small resonant structure, to couple energy from the linear beam, causing the ultra-small resonant structure to resonate and emit electromagnetic radiation as a result of the resonance at a resonance wavelength less than a microwave wavelength, the ultra-small resonant structure having at least one dimension smaller than the resonance wavelength;

(d) terminating the electron beam at a destination anode.

7. A method according to claim 6, further including the steps of providing the ultra-small resonant structure inside of the depressed anode, providing an opening in the depressed anode, and arranging the ultra-small resonant structure within the depressed anode so the electromagnetic radiation emitted by the ultra-small resonant will depart the depressed anode through the opening.

* * * * *